(12) United States Patent
Doyle et al.

(10) Patent No.: US 7,285,829 B2
(45) Date of Patent: Oct. 23, 2007

(54) SEMICONDUCTOR DEVICE HAVING A LATERALLY MODULATED GATE WORKFUNCTION AND METHOD OF FABRICATION

(75) Inventors: Brian Doyle, Portland, OR (US); Scott A. Hareland, Tigard, OR (US); Mark Doczy, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/816,232

(22) Filed: Mar. 31, 2004

(65) Prior Publication Data

US 2005/0224886 A1 Oct. 13, 2005

(51) Int. Cl.
*H01L 29/72* (2006.01)

(52) U.S. Cl. .................. 257/368; 257/401; 257/407; 257/412

(58) Field of Classification Search ............... 257/368, 257/407, 333, 344, 381, 389, 412, 401
See application file for complete search history.

(56) References Cited

U.S. PATENT DOCUMENTS

| | | | |
|---|---|---|---|
| 6,096,641 A | 8/2000 | Kunikiyo | |
| 6,300,177 B1 | 10/2001 | Sundaresan et al. | |
| 6,312,995 B1 | 11/2001 | Yu | |
| 6,586,808 B1 * | 7/2003 | Xiang et al. | 257/407 |
| 6,737,309 B2 * | 5/2004 | Matsuo | 438/199 |
| 6,744,101 B2 * | 6/2004 | Long et al. | 257/368 |
| 2003/0132466 A1 | 7/2003 | Shin et al. | |
| 2003/0153139 A1 | 8/2003 | Ang et al. | |

FOREIGN PATENT DOCUMENTS

| | | |
|---|---|---|
| EP | 0856892 A2 | 8/1998 |
| JP | 62073668 | 4/1987 |
| JP | 05226361 | 9/1993 |
| JP | 05226362 | 9/1993 |
| JP | 05243564 | 9/1993 |
| WO | WO 00/77828 | * 12/2000 |
| WO | WO 0077828 A2 | 12/2000 |

OTHER PUBLICATIONS

International Searching Authority Report (ISR) PCT/US05/010506 and Written Opinion of ISA mailed Nov. 30, 2005.

(Continued)

*Primary Examiner*—Edward Wojciechowicz
(74) *Attorney, Agent, or Firm*—Blakely, Sokoloff, Taylor & Zafman LLP

(57) ABSTRACT

A transistor comprising a gate electrode formed on a gate dielectric layer formed on a substrate. A pair of source/drain regions are formed in the substrate on opposite sides of the laterally opposite sidewalls of the gate electrode. The gate electrode has a central portion formed on the gate dielectric layer and over the substrate region between the source and drain regions and a pair sidewall portions which overlap a portion of the source/drain regions wherein the central portion has a first work function and said pair of sidewall portions has a second work function, wherein the second work function is different than the first work function.

34 Claims, 9 Drawing Sheets

OTHER PUBLICATIONS

Anonymous: "MOS Transistor with Engineered Metal Electrodes, including fabrication process." Research Disclosure, Kenneth Mason Publications, Westbourne, GB, vol. 438, No. 1, Oct. 2000.

Frohlich K et al: "Ru and RuO2 gate electrodes for advanced CMOS technology" Materials Science and Engineering B, Elsevier Sequoia, Lausanne, CH, vol. 109, No. 1-3, Mar. 5, 2004, pp. 117-121.

Lander R J P et al: "A Tuneable Metal Gate Work Function Using Solid State Diffusion of Nitrogen," Proceedings of the 32nd European Solid-State Device Research Conference, Univ. of Bologna, Bologna, Italy, 2002, pp. 103-106.

Lin R et al., "An Adjustable Work Function Technology Using Mo Gate for CMOS Devices," IEEE Electron Device Letters, IEEE Inc., New York, vol. 23, No. 1, Jan. 2002, pp. 49-51.

International Preliminary Report on Patentability and Written Opinion from PCT/US2005/010506 mailed Oct. 12, 2006, 10 pgs.

U.S. Appl. No. 11/099,190, Office action, (Dec. 14, 2006),1-16.

* cited by examiner

SEMICONDUCTOR DEVICE HAVING A LATERALLY MODULATED GATE WORKFUNCTION AND METHOD OF FABRICATION

BACKGROUND OF THE INVENTION

1. Field of the Invention

The present invention relates to the field of semiconductor manufacturing and more specifically to a metal insulated semiconductor field effect transistor having a laterally modulated gate work function.

2. Discussion of Related Art

FIG. 1 illustrates a metal insulated insulating semiconductor field effect transistor (MISFET) 100. MISFET 100 includes a gate electrode 150 formed on a gate dielectric layer 120 which in turn is formed on a silicon substrate 102. Transistor 100 includes a pair source/drain regions formed on substrate 102 along laterally opposite sidewalls of gate electrode 150. The source/drain regions each typically include a shallow source/drain extension or tip region 140 and a relatively deep source/drain contact region 110 as shown in FIG. 1. A pair sidewall spacers 130 are formed along laterally opposite sidewalls of gate electrode 140. Sidewall spacers 130 are used to mask the source/drain tip implants from the heavy source/drain implants. The portion of the silicon substrate 102 located beneath the gate electrode and between the source/drain extension 140 defines the channel region 114 of the device. The gate electrode 150 typically slightly extends over the source/drain extension or tip regions 140 as shown in FIG. 1. Gate electrode 150 is typically formed from doped polycrystalline silicon. Alternatively, the gate electrode can be formed from a metal film. Metal gate electrodes 150 are likely to become mainstream technology in coming generations due to the elimination of poly depletion effects and subsequent improvement in gate control over the channel. The gate electrode can be formed from a single film or a composite stack of films. The gate electrode 150, however, has a constant or uniform work function across the device. That is, the work function of the gate electrode is constant from one source/drain region across the channel region to the other source/drain region.

BRIEF DESCRIPTION OF THE DRAWINGS

FIGS. 3A-3K illustrate a method of forming a transistor having a modulated gate work function in accordance with an embodiment of the present invention.

DETAILED DESCRIPTION OF THE PRESENT INVENTION

The present invention is a metal insulated semiconductor field effect transistor (MISFET) having a laterally modulated gate work function as a method of fabrication. In the following description, numerous specific details have been set forth in order to provide a thorough understanding of the present invention. In other instances, well-known semiconductor fabrication processes and techniques have not been set forth in particular detail in order to avoid unnecessarily obscuring the present invention.

An embodiment of the present invention is a metal insulator semiconductor field effect transistor (MISFET) having a laterally modulated gate work function and its method of fabrication. The laterally modulated gate work function improves MISFET performance by providing reduced series resistance in the tip or source/drain extension region and by providing more control of the threshold voltage near the source end of the device to enhance source injection efficiency.

Figure 1:
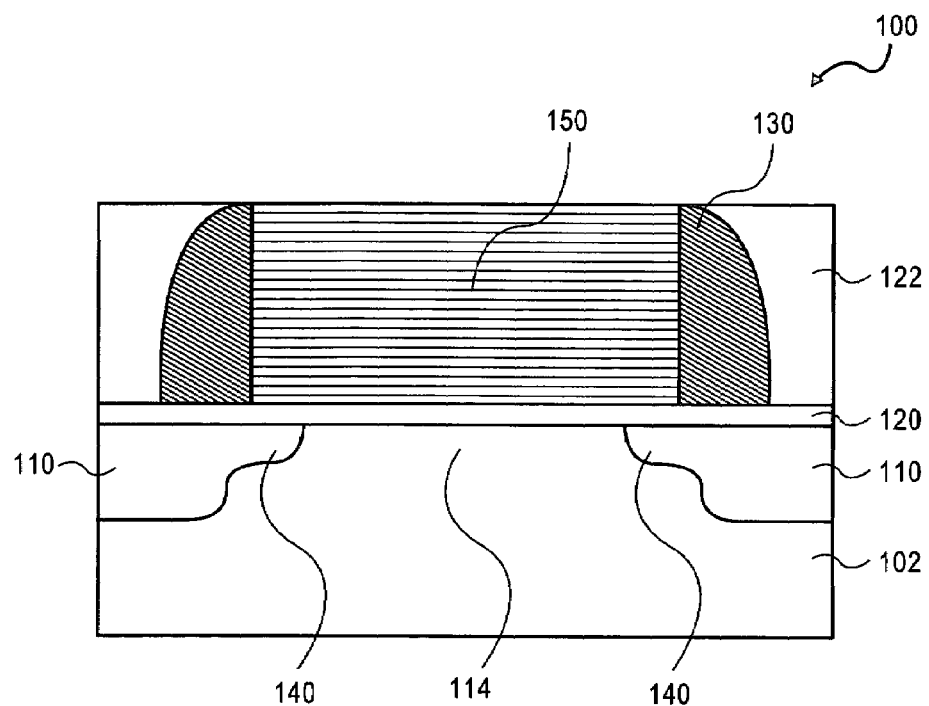
FIG. 1 illustrates a conventional transistor.
Figure 2:
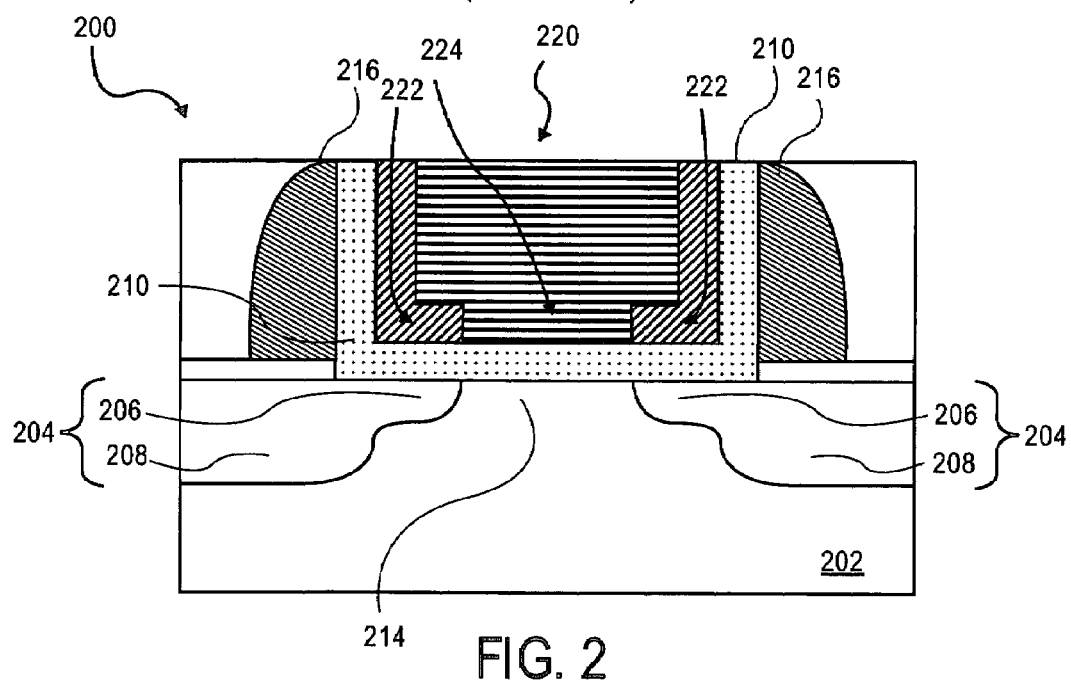
FIG. 2 is an illustration of a cross sectional view of a metal insulated semiconductor field effect transistor (MISFET) having a modulated gate work function in accordance with an embodiment of the present invention.

An example of a MISFET device 200 in an embodiment of the present invention is illustrated in FIG. 2. The transistor 200 can be formed on a semiconductor substrate such as a silicon substrate 202. Transistor 200 has a pair of source/drain regions 204 formed in the semiconductor substrate 202. The source/drain regions 204 each comprise a shallow tip or source/drain extension region 206 and a deep source/drain contact region 208. The transistor 200 includes a gate dielectric layer 210 which is formed on the semiconductor substrate 202. In an embodiment of the present invention, the gate dielectric layer is a high-K dielectric such as, but not limited to, metal oxide dielectric such as tantalum oxide, titanium oxide, zirconium oxide, and hafnium oxide. A gate electrode 220 is formed on the gate dielectric layer 210 as shown in FIG. 2. The semiconductor substrate 202 located beneath the gate electrode/gate dielectric layer and between the source/drain regions 204 is the channel region 214 of the device where a conductive inversion layer forms to allow current to travel between the source/drain regions 204. A pair of sidewall spacers 216 are formed along laterally opposite sidewalls of the gate electrode 220.

The gate electrode 220 has a pair of sidewall or overlap portions 222 and a central portion 224. The overlap or sidewall portions 222 are formed of a first conductive material having a first work function and the central portion 224 is formed of a second conductive material having a second work function wherein the second work function is different than the first work function. Gate electrode 220 can be said to have a modulated work function because the outside sidewall portions 222 have one work function and the central portion as a second different work function. Additionally, gate electrode 220 can be said to be a bimetallic gate electrode because the sidewall or overlap portions 222 can be formed from a first metal and the central portion 224 can be formed from a second different metal.

In an embodiment of the present invention, overlap portion 222 is formed over a portion of the source/drain regions 204 which extends beneath the gate electrode 220. In an embodiment of the present invention, the sidewall or overlap portions 222 are formed over the underlying source/drain extension regions 206. In an embodiment of the present invention, the overlap portion substantially cover or forms substantially in alignment with the underlying source/drain extension or tip regions 206 as shown in FIG. 2. In an embodiment of the present invention, the majority of the channel region 214 is covered and controlled by the central portion 224 of gate electrode 220. In an embodiment of the present invention, the central portion 222 approximately aligns with the transistors channel region 214 as shown in FIG. 2. In an embodiment of the present invention, the central portion 224 comprises at least 50% of the gate electrode length and ideally at least 70% of the gate electrode length 220. In an embodiment of the present invention, the work function of the central portion 224 of the gate electrode governs the off state characteristics of the device.

In an embodiment of the present invention, transistor 200 is an n type transistor where the majority carriers are electrons. When transistor 200 is an n type transistor, source/drain regions 204 are doped to an n type conditivity typically between 0.001-0.01 1/µΩ-cm and the channel region 214 of the substrate 202 is doped to a p type conductivity between 1-100 1/Ω-cm. In an embodiment of the present invention, when the transistor 200 is a n type transistor the central portion 224 is formed from a conductive material having a work function tailored for a n type device. In an embodiment of the present invention, when transistor 200 is an n type transistor, the central portion 224 of gate electrode 220 is formed of a conductive material having a work function between 3.9 to 4.3 eV. In an embodiment of the present invention, transistor 200 is an n type transistor and the central portion 224 of the gate electrode is formed from a material selected from the group consisting of polysilicon, titanium (Ti), zirconium (Zr), hafnium (Hf), tantalum (Ta), and aluminum (Al). In an embodiment of the present invention, transistor 200 is an n type transistor where the outside portions 222 are formed from a material having a work function between 1.5 to 3.8 eV. In an embodiment of the present invention, transistor 200 is the n type transistor and the overlap portions 222 of gate electrode 220 are formed from the material selected from the group consisting of scandium (Sc), magnesium (Mg), and yttrium (Y). In an embodiment of the present invention, when transistor 200 is an n type transistor, the overlap portions 222 of the gate electrode 220 are formed of a material having a work function which is at least 0.1 eV less than and ideally 0.5 eV less than the work function of the material forming the central portion 224 of gate electrode 220.

In a n type transistor by keeping the work function of the overlap portions 222 over the tip regions lower than the work function of the central portion 224 increases the majority carrier density at a fixed gate voltage thereby reducing the tip resistance which translates into device performance via reduced are $R_{external}$. Additionally, lowering the work function of the gate electrode near the source end of the device achieves a higher carrier population (through a lower source and threshold voltage) while allowing the off-state characteristics of the device 200 to be governed by the work function of the central portion 224 of the gate electrode. In this way, the electrical characteristics and performance of transistor 200 can be improved.

In an embodiment of the present invention, transistor 200 is a p type transistor where the majority carriers are holes. When transistor 200 is a p type transistor, source/drain regions 204 can be doped to a p type type conducitivity typically between 0.001-0.01 1/µΩ-cm while the channel region 214 of substrate 202 is doped to n type conductivity between 1-200 1/Ω-cm In an embodiment of the present invention, when the transistor 200 is a p type transistor the central portion 224 is formed from a material having a work function tailored for a p type device. In an embodiment of the present invention, transistor 200 is a p type transistor wherein the central portion 224 is formed of a material having a work function between 4.9 to 5.3 electron volts. In an embodiment of the present invention, transistor 200 is a p type transistor wherein the central portion 224 of gate electrode 220 is formed from a material selected from the group consisting of ruthenium (Ru) and palladium (Pd). In an embodiment of the present invention, transistor 200 is a p type transistor and the outside portions 222 of gate electrode 220 are formed from a material having a work function between 5.4 to 6.0 electron volts. In an embodiment of the present invention, when transistor 200 is a P-type transistor wherein the outside portions 222 of gate electrode 220 are formed from material selected from the group consisting of poly-silicon, platinum (Pt), and ruthenium nitride (RuN). In an embodiment of the present invention, when transistor 200 is a p type transistor, the outer portions 222 of gate electrode 220 have a work function of at least 0.1 eV greater and ideally 0.5 eV electron volts greater than the work function of the central portion 224.

FIGS. 3A-3J illustrate a method of forming a transistor having a gate electrode with a laterally modulated work function utilizing a replacement gate process in accordance with an embodiment of the present invention.

The fabrication process begins with a semiconductor substrate 300. In an embodiment of the present invention, the semiconductor substrate 300 is a mono-crystalline silicon substrate or wafer. Semiconductor substrate 300, however, can be other types of substrate, such as for example, a silicon on an insulator substrate, a germanium substrate, a gallium arsenic substrate, an InSb, substrate, a GaP substrate, a GaSb substrate, and a carbon nanotubes. When fabricating an n type transistor or NMOS transistor, the substrate can be doped to a p type conductivity. When fabricating a p type transistor or a PMOS transistor, the substrate can be doped to an n type conductivity. In an embodiment of the present invention, a silicon mono-crystalline substrate is doped with boron atoms to a concentration between $10^{15}$-$10^{17}$ cm$^{-3}$ when fabricating in an n type transistor. In an embodiment of the present invention, a silicon mono-crystalline substrate is doped with arsenic or phosphorous atoms to a concentration between $10^{15}$-$10^{17}$ cm$^{-3}$ when forming a p type transistor.

Figure 3A:
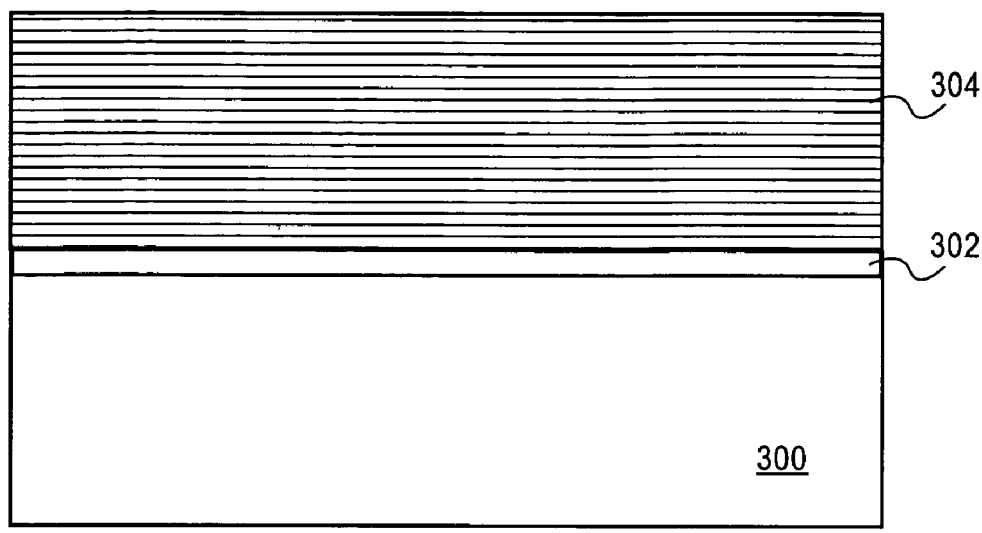

Next, a sacrificial gate dielectric layer 302 is formed over the substrate 300. The sacrificial gate dielectric layer 302 can be any well known dielectric layer such as, but not limited to, a grown or deposited silicon oxide layer or a deposited silicon nitride layer. Next, as shown in FIG. 3A, a sacrificial gate electrode material 304 is formed over the sacrificial gate dielectric layer 302. The sacrificial gate electrode material 304 is formed to approximately the thickness desired for the gate electrode of the device. The sacrificial gate electrode material 304 is formed of a material which can be selectively removed or etched away without etching away an adjacent interlayer dielectric, such as a silicon oxide film or silicon nitride film during the replacement gate process. Additionally, the sacrificial gate electrode material is ideally a material which can mask the channel region during ion implantation steps used to form the source and drains of the device. In an embodiment of the present invention, the sacrificial gate electrode material is polycrystalline silicon. In an embodiment of the present invention, the sacrificial gate electrode material is formed to a thickness desired for the thickness of the subsequently formed gate electrode. In an embodiment of the present invention, the sacrificial gate electrode material 304 is formed to a thickness between 400 and 2000 Å

Figure 3B:
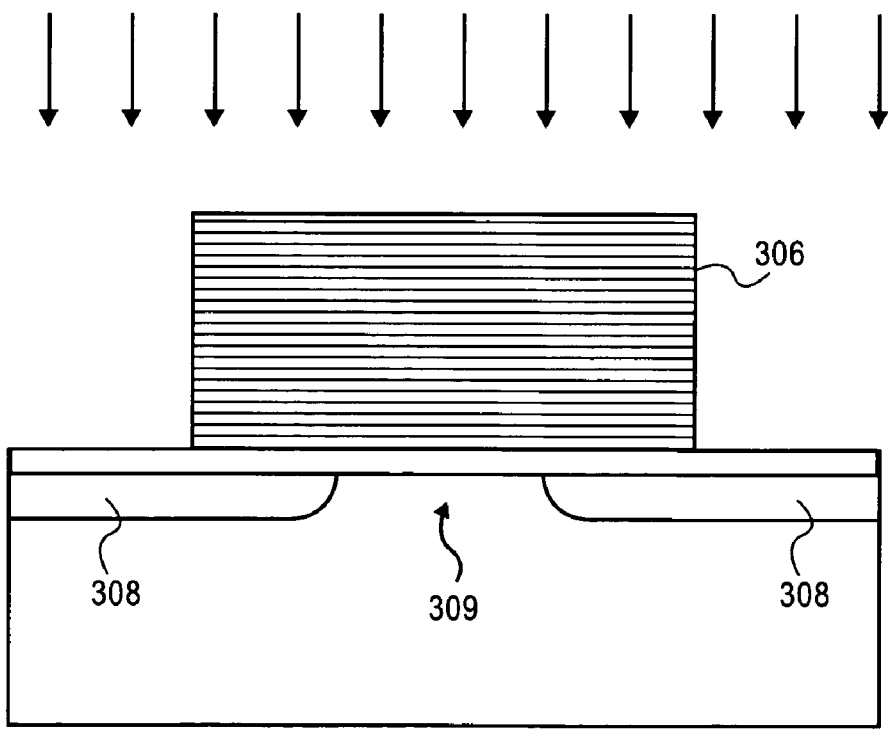

Next, as shown in FIG. 3B, the gate electrode material 304 is patterned into a sacrificial gate electrode 306. The sacrificial gate electrode 306 is patterned to substantially the length and width desired for the gate electrode of the device. The gate electrode material can be patterned utilizing well-known photolithography and etching techniques.

Next, a pair of source/drain extension or tip regions 308 are formed in substrate 300 as shown in FIG. 3B. When forming an n type device, the tip regions are formed of an n type conductivity and when forming a p type device, the tip regions are formed of a p type conductivity. In an embodiment of the present invention, the tips or source/drain extensions 308 are formed to a concentration between $10^{19}$-$10^{21}$ cm$^{-3}$. P type source/drain extension 308 can be formed by ion implanting boron atoms into a substrate 308 and n type source/drain extensions 308 can be formed by ion implanting arsenic or phosphorous atoms into substrate 308. The sacrificial gate electrode 306 masks the channel region from the ion implantation process so that the channel region 309 remains p type for an n type device and n type for a p type device. The ion implantation places dopants substantially in alignment with the outside edges of the sacrificial gate electrode 306. The source/drain extensions can be activated at this time if desired or they can be activated during the deep source/drain contact formation step or during other subsequent processes, such a silicide formation step. The activation process will cause the dopant atoms to slightly diffuse beneath the outside edges of the sacrificial gate electrode as shown in FIG. 3B. Any well known activation anneal such as a rapid thermal anneal or a furnace anneal may be utilized to activate the dopants to form the source/drain extensions 308.

Figure 3C:
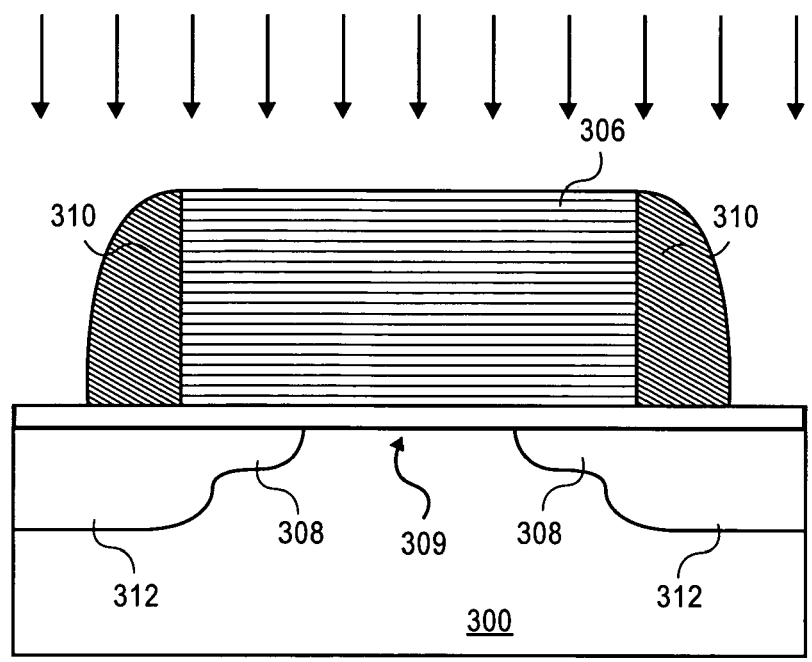

Next, a pair of sidewall spacers 310 are formed along laterally opposite sidewalls of sacrificial gate electrode 306 as shown in FIG. 3C. Sidewall spacers 310 can be any well-known dielectric such as silicon oxide or silicon nitride or combinations thereof. Sidewall spacers 310 can be formed by blanket depositing a conformal dielectric or composite dielectric over the substrate 300, including sacrificial gate dielectric layer 302, the sidewalls of sacrificial gate electrode 306 and a top surface of sacrificial gate electrode 306, and then anisotropically etch back so that the sidewall spacer material is removed from horizontal surfaces but remains adjacent to vertical surfaces such as sidewalls of the sacrificial gate electrode 306 to form sidewall spacers 310. The width of the sidewall spacers 310 is approximately equal to the thickness of the sidewall spacer film deposited over the substrate. Sidewall spacers 310 are generally formed to a width desired for the length of the source/drain extensions.

After forming sidewall spacers 310, source/drain contact regions 312 can be formed. When forming an n type device, the heavy source/drain contact regions 312 are n type conductivity and when forming a p type device, the heavy source/drain contact regions are p type conductivity. In an embodiment of the present invention, the heavy source/drain contact regions are formed to a concentration between $10^{20}$-$10^{21}$ cm$^{-3}$. It is appreciated that the heavy source/drain contact regions 312 are formed deeper into the substrate than the relatively shallow source/drain extensions 308 as shown in FIG. 3C. The heavy source/drain contact regions 312 can be formed by well-known ion implantation techniques. Sidewall spacers 310 mask the source/drain extension regions 308 from the heavy and deep source/drain contact region implantation step and prevent them from becoming overwhelmed by the heavy source/drain implantation. The heavy source/drain implantation step places dopants substantially in alignment with the outside edges of sidewall spacers 310. A subsequent anneal to activate the dopants will cause the dopants to slightly diffuse beneath sidewall spacers 310 as shown in FIG. 3C. Any well-known activation anneal such as a high temperature rapid thermal process or a furnace anneal can be utilized to activate the dopants and form the heavily doped source/drain contact regions 312 as shown in FIG. 3C. It is to be appreciated that the source/drain contact regions 312 and the source/drain extensions 308 together form the source/drain regions of the device.

Figure 3D:
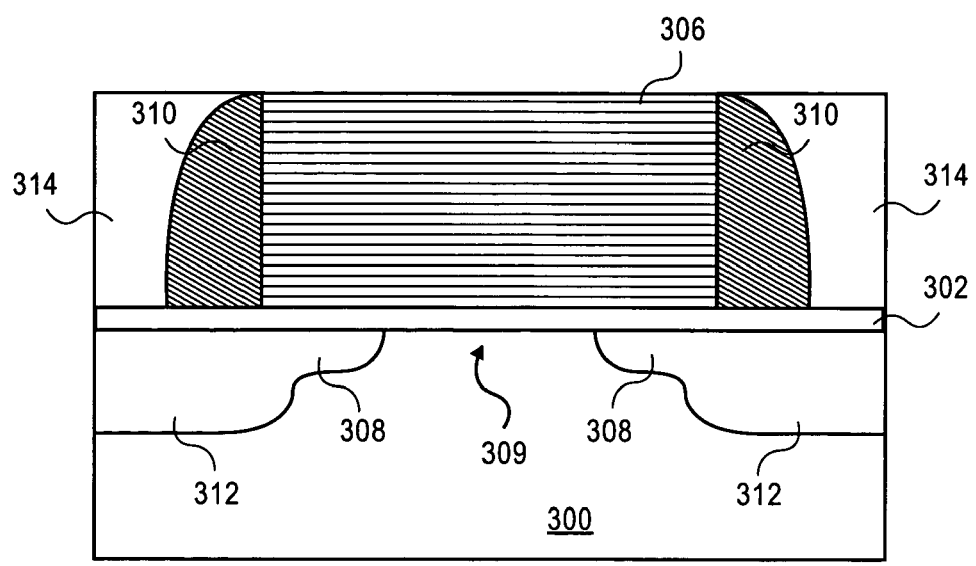

Next, an interlayer dielectric (ILD) is blanket deposited over substrate 300, including sacrificial gate dielectric layer 302, sacrificial gate electrode 306 and sidewall spacers 310. The interlayer dielectric layer 314 is formed of a material which can be selectively etched with respect to the sacrificial gate electrode material 306. That is, dielectric layer 314 is formed of a material which will not be significantly etched by the etchant used to etch away sacrificial gate electrode 306. In an embodiment of the present invention, ILD 314 is a silicon dioxide film. ILD 314 is deposited to a thickness greater than the thickness of sacrificial gate electrode 306 so that an interlayer dielectric layer 314 can subsequently be polished back to the height of sacrificial gate electrode 306. After deposition of ILD 314, ILD 314 is planarized back so as to expose the top surface of sacrificial gate electrode 306 and to make the top surface of interlayer dielectric 314 planar with the top surface of sacrificial gate electrode 306 as shown in FIG. 3D. Planarization in layer dielectric 314 can be accomplished with the well-known chemical mechanical planarization or a plasma etch-back process.

Figure 3E:
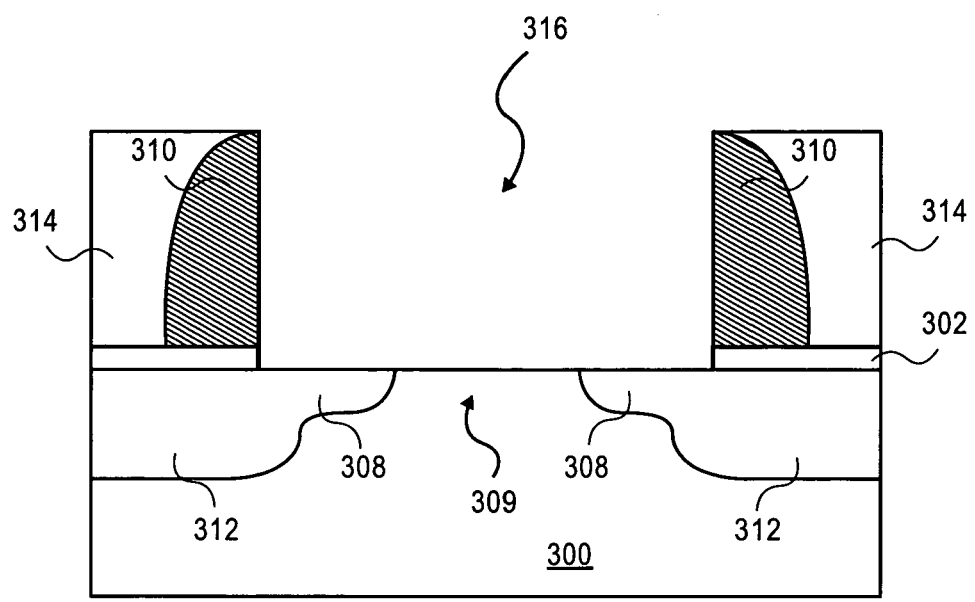

Next, as shown in FIG. 3E, the sacrificial gate electrode 306 is removed to form an opening or trench 316. Sacrificial gate electrode 306 is removed with an etchant which etches away the sacrificial gate electrode 306 without significantly etching away ILD 314 and spacers 310. When ILD 314 is an oxide film, and spacers 310 are an oxide or silicon nitride or a combination thereof and sacrificial gate electrode 306 is polycrystalline silicon, a wet etchant comprising NH$_4$OH or TMAH can be used. The gate removal etchant preferably has a selectivity to the ILD and spacers of at least 20:1. Additionally, as shown in FIG. 3E, at this time the sacrificial gate dielectric layer 302 in opening 316 can be removed so that a new gate dielectric layer can be formed on the substrate 300. Alternatively, in an embodiment of the present invention, instead of forming a sacrificial gate dielectric layer 302 as illustrated in FIG. 3A, a permanent gate dielectric layer for the device can be formed during the processing of FIG. 3A. In this way a high temperature process can be utilized to form the gate dielectric layer if desired. In such a case, the gate dielectric layer formed as FIG. 3A would remain on substrate 300 in opening 316 and the gate electrode would be formed thereon.

Figure 3F:
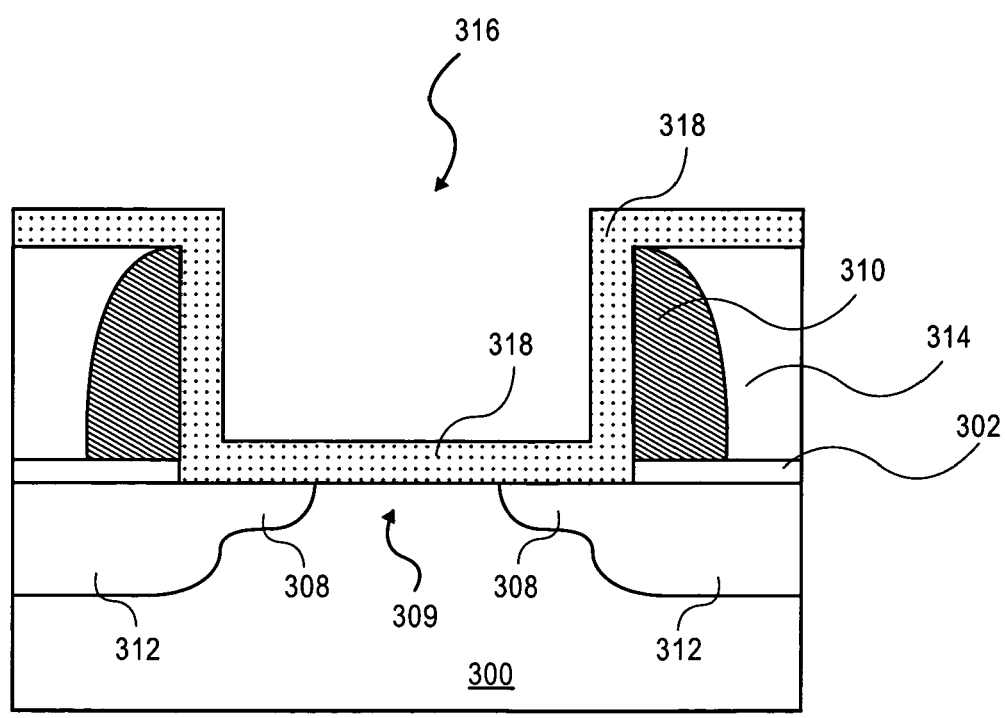

Next, as shown in FIG. 3F, a gate dielectric layer 318 is formed on substrate 300. In an embodiment of the present invention, the gate dielectric layer 318 is a high dielectric constant (high-K) dielectric film such as, but not limited to, metal oxides such as titanium oxide, tantalum oxide, zirconium oxide, hafnium oxide, or other high-K type film such as PZT and BST. Any well-known technique can be used to deposit the high-K dielectric film such as chemical vapor deposition. In an embodiment of the present invention, a high-K dielectric film having a dielectric constant greater than 10 is deposited to a thickness between 10 and 50 Å. Alternatively, a dielectric film such as a silicon dioxide or silicon oxynitride film can be grown on the exposed surface of substrate 300 in trench 316, utilizing well-known processes such as for example, a wet/dry oxidation process. When depositing the gate dielectric, it will form not only on the substrate 300, but also on the sidewalls of opening 316 as well as onto the top surface of ILD 314 and spacers 310 as shown in FIG. 3F. When the gate dielectric layer is grown, it will form only on the exposed surface of substrate 300.

Figure 3G:
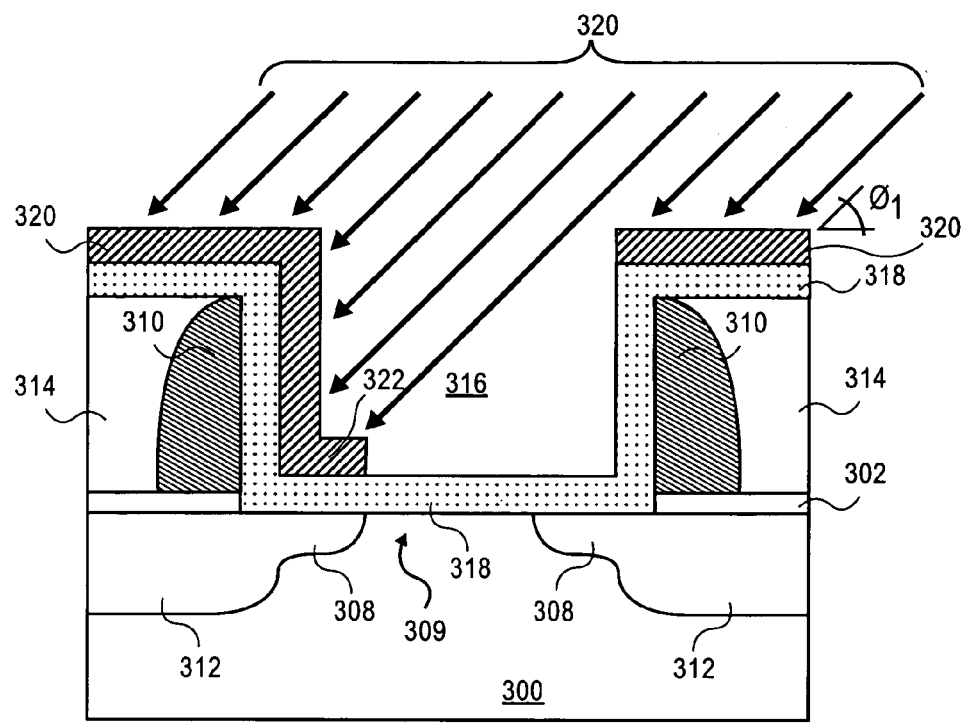
Figure 3H:
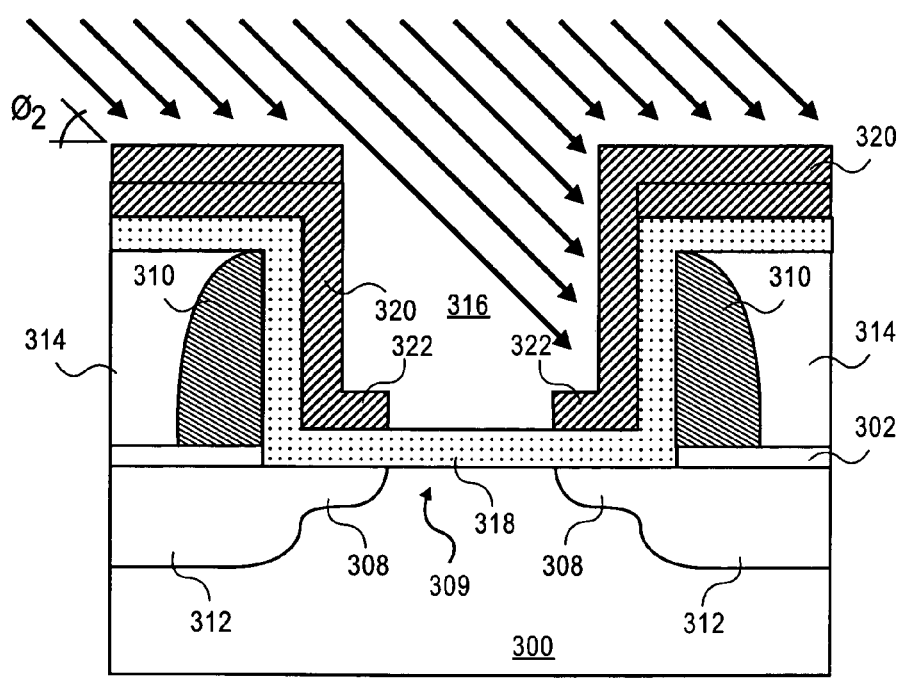
Figure 31:
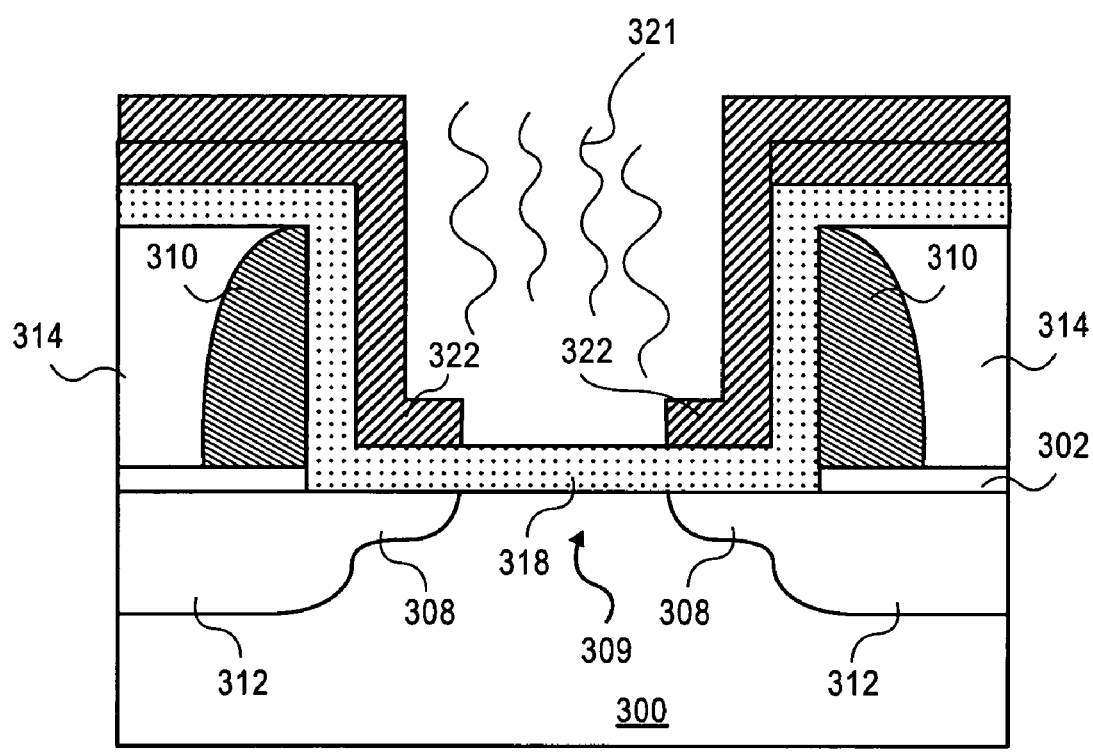

Next, as shown in FIGS. 3G and 3H, a first metal or conductive material having a first work function material is formed on the outside edges or sidewalls of the gate opening 316 as shown in FIGS. 3G and 3H. In an embodiment of the present invention, the first metal or conductive material 320 is sputter deposited in a two-part process. The first part of the first metal film is sputter deposited on one sidewall of trench 316 as shown in FIG. 3G. In an embodiment of the present invention, the first metal 320 is sputter deposited at an angle $\varnothing_1$. The angle $\varnothing_1$ is chosen such that the sputtered metal film forms only on one of the sidewall of opening 316 as shown in FIG. 3G. The first deposition process uses the sputter angle ($\varnothing_1$) which causes the first metal to deposit only on one sidewall. The angle is chosen such that the center and second sidewall of the gate opening 316 are masked by the dielectric layer 314 trench. Next, a second sputter deposition process is used to deposit a second portion of the first metal 320 onto the second sidewall or face of opening 316. Like the first sputter deposition process, the second sputter deposition process sputters metal 320 at an angle $\varnothing_2$ which causes a first metal to deposit only on the second face or sidewall of the gate opening 316. That is, during the second sputter deposition process, an angle $\varnothing_2$ is chosen so that the first face or sidewall is masked by the trench. It is to be noted that because the first sputter deposition process forms a metal film onto the top surface 315 of ILD 314 (and gate dielectric 318) the angle ($\varnothing_2$) of the second deposition process may need to be adjusted to account for the increased thickness formed on ILD 314 during the first deposition process. In an embodiment of the present invention, the first portion of the fist metal film is deposited at a first sputter angle $\varnothing_1$ which is less than the second sputter angle $\varnothing_2$ used to deposit the second portion of the first metal film. In an embodiment of the present invention, the first sputter angle $\varnothing_1$ is between 45° and 80° and the second sputter angle $\varnothing_2$ is between 45°-80°.

The sputter angle thickness of ILD and width of the trench 316 all determine how far from the sidewalls towards the center of the trench 316, the first metal film 320 will extend. In an embodiment of the present invention, the first metal film 320 is deposited so that it forms overlap or sidewall portions 322 which cover or overlay at least a portion of the tip or source/drain extension. In an embodiment of the present invention, the first metal film is deposited so that it forms overlap or sidewall portions 322 which cover and are substantially aligned with the underlying tip region 308 as shown in FIG. 3H. In yet, another embodiment of the present invention, the first metal film is deposited so that it covers the entire tip region beneath the gate electrode and extends slightly into the channel region 309 of the device.

In an embodiment of the present invention, as shown in FIG. 3I, the work function of the first metal film 320 can be altered by exposing the first metal film to reactive species. The reactive species can be generated or provided by, for example, a plasma process, a remote plasma process, an angled ion implantation, a chemical treatment, or a thermal annealing. In an embodiment of the present invention, the reactive species react with the first metal film to increase the work function of the deposited first metal film. In an alternative embodiment of the present invention, the reactive species react with the first metal film to decrease the work function of the first metal film 320. Examples of reactive species which can be used to alter the work function of a metal film include but are not limited to strong Al, Sc, Y, Pt, N, O, Cl, F.

Figure 3J:
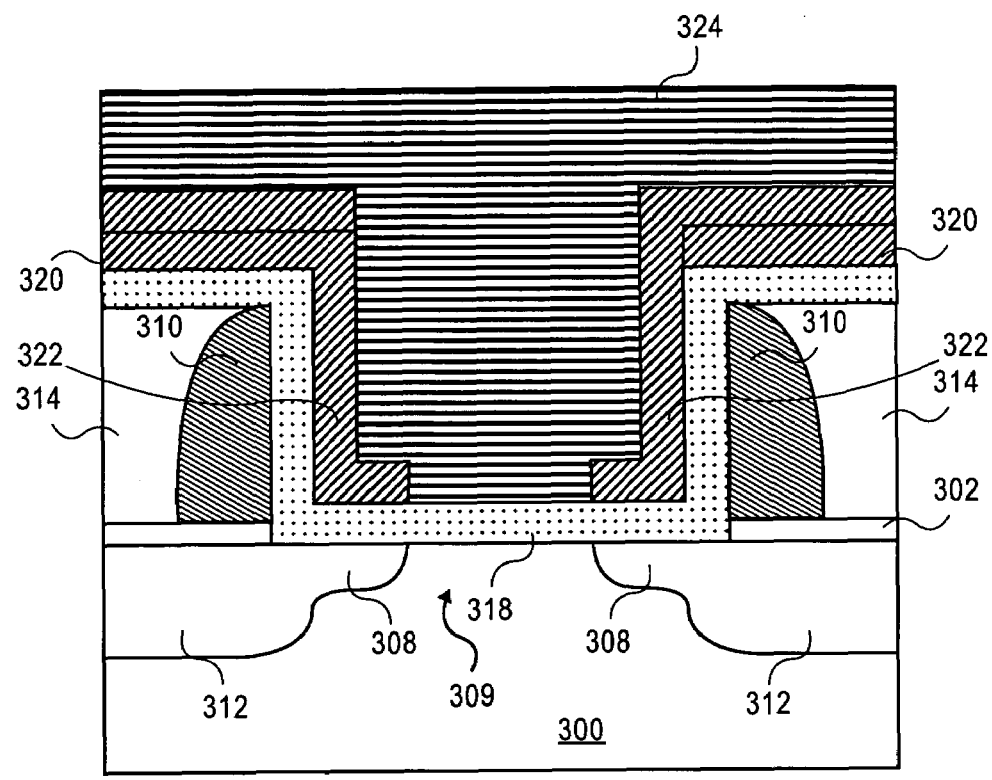
Figure 3K:
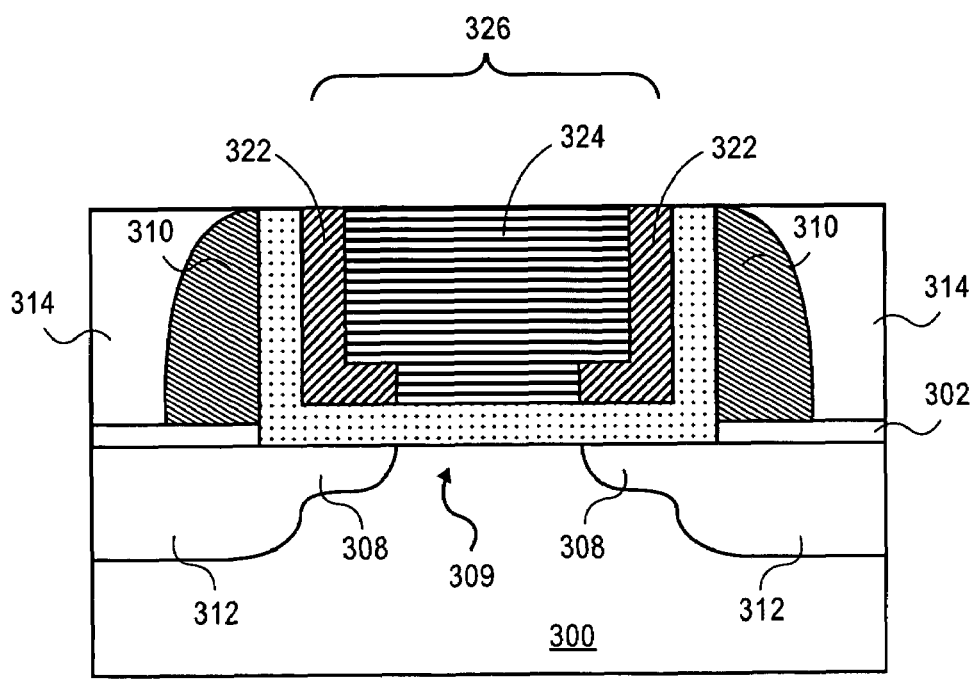

Next, as shown in FIG. 3J, a second metal or conductive material 324 having a second work function is deposited to fill trench 316 as shown in FIG. 3J. The second metal film is deposited onto the gate dielectric layer 318 in the center portion of trench 316. The second metal film 324 is deposited to a thickness and by a method sufficient to completely fill trench 316 between sidewall or overlap portions 322 as shown in FIG. 3J. In an embodiment of the present invention, the second metal film 324 has a higher work function than the first metal film or the reactive species exposed first metal film. In an embodiment of the present invention, the second metal film 322 is formed with a metal film which has a lower work function than the first metal film or the reactive species exposed first metal film. It is to be noted that in an embodiment of the present invention, the first conductive material 320 used to form the overlap or sidewall portions 322 can be the same conductive material as used to form the central portion, but then exposed to reactive species during processing shown in FIG. 3I to alter the work function so that the overlap portions 322 have a different work function than the central portion 324. The central portion of trench 316 can be filled with any suitable technique including a conformal deposition process, such as but not limited to chemical vapor deposition (CVD), plasma enhance chemical vapor deposition (PECVD) and atom layer deposition (ALD). Such conformal processes will also form the second metal film 324 on the top surface of a first metal film 320 formed on ILD 314 (or on gate dielectric layer 318 when formed on ILD 314). Next, the second metal film 324 and the first metal film 320 (as well as gate dielectric layer 318 when formed on ILD 314) are removed from ILD 314 to form a gate electrode 326 having a laterally modulated gate work function as shown in FIG. 3K. The second metal film 324 and the first metal film 320 can be removed by any well known processes, such as chemical mechanical planarization or plasma etch back. The substrate is planarized back until the top surface of the metal film in trench 324 is substantially planar with ILD 314. This completes the fabrication of MISFET device with a metal gate electrode having a laterally modulated gate work function.

Subsequent well known processes can be used to form interlayer dielectric and metal interconnects to electrically couple fabricated MISFET transistors formed on substrate 300 together in functional integrated circuits.

Figure 4A:
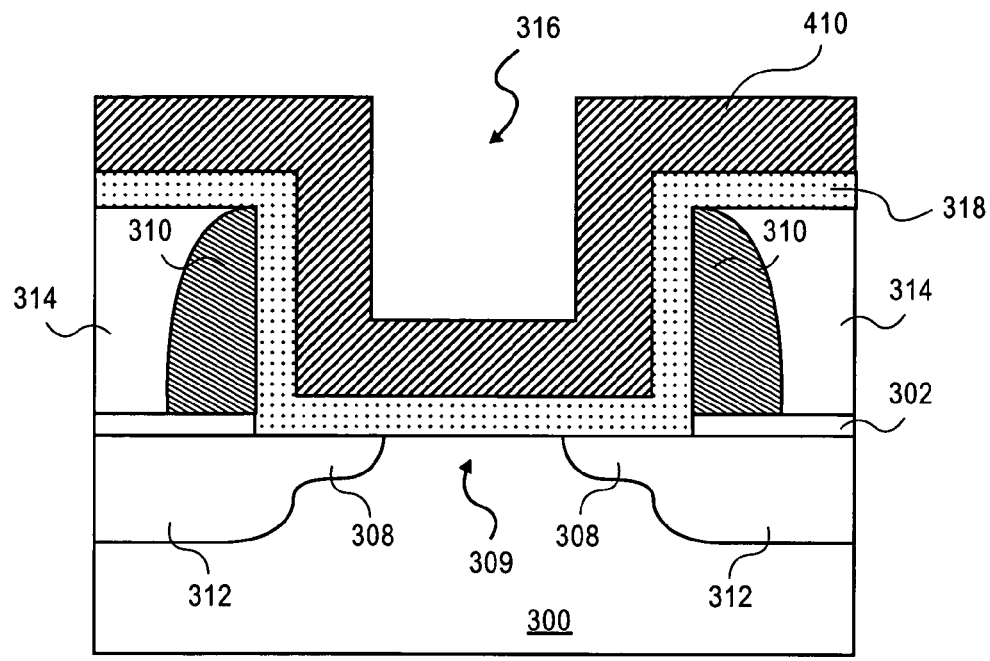
FIGS. 4A-4D illustrate a method of forming a transistor having a modulated gate work function in accordance with an embodiment of the present invention.

FIGS. 4A-4D illustrate an alternative method of forming a MISFET with a laterally modulated gate electrode in accordance with an embodiment of the present invention. FIG. 4A illustrates substrate 300 after having been previously processed by techniques as illustrated to obtain the substrate of FIG. 3F.

Figure 4B:
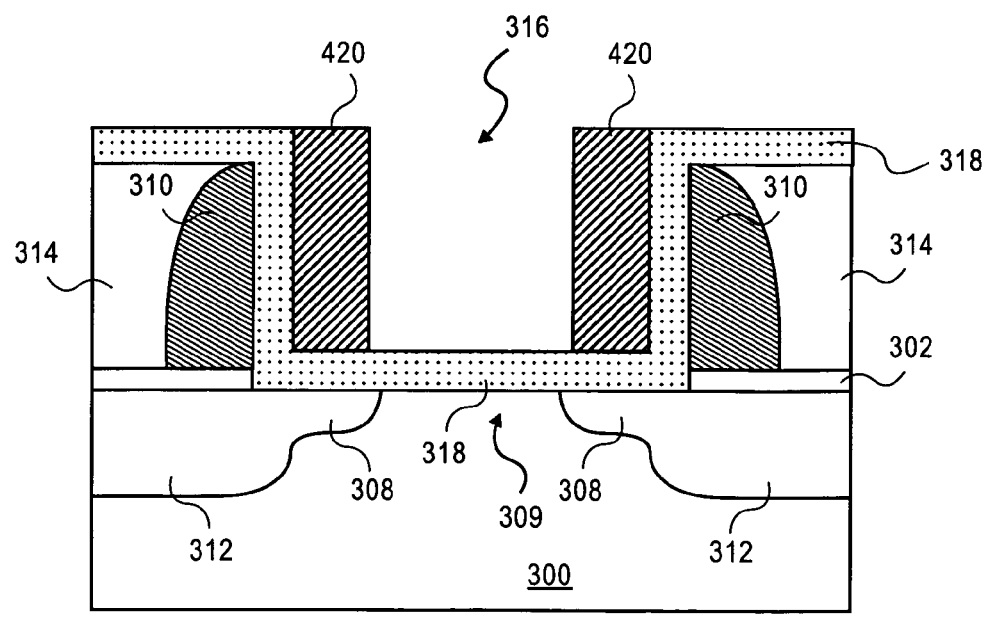
Figure 4C:
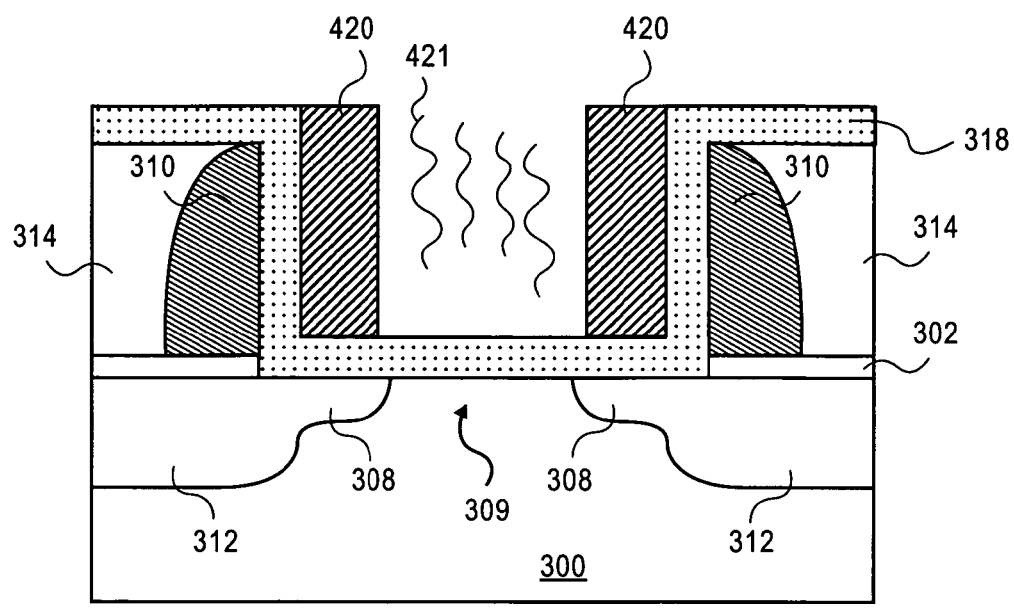

Next, a first metal film 410 having a first work function is deposited over ILD 314 and adjacent to the sidewalls of trench 316 and onto the gate dielectric layer 318 over channel region 309 in trench 316 as shown in FIG. 4A. In an embodiment of the present invention, the first metal film 410 having a first work function is formed by conformal process so that the metal film forms to substantially the same thickness on vertical surfaces, such as the sidewalls of trench 316 as onto horizontal surfaces, such as the top surface of ILD 314 (or gate dielectric 318) and into the bottom of trench 309. Any well known technique which can deposit a conformal film, such as but not limited to chemical vapor deposition (CVD), plasma enhanced chemical vapor deposition (PECVD), and atomic layer deposition (ALD) can be used to deposit first metal film 410. Next, as shown in FIG. 4B, the first metal film 410 is subjected to an anisotropic etch back process. The anistropic etch back process remove the metal 410 from horizontal surfaces, such as the top of ILD 314 (and dielectric layer 318) and from dielectric layer 318 over channel region 309 in trench 316 as shown in FIG. 4B. The anisotropic etch back process of first metal layer 410 leaves metal film 410 adjacent to vertical surfaces, such as sidewalls of trench 316 to form the overlap or sidewall portions 420 of the gate electrode. The width of the overlap portion or sidewall portion 420 of gate electrode 420 is substantially equal to the thickness of the first metal film 410 deposited over the substrate in FIG. 4A. A conformal deposition process followed by an anisotropic etch back provides a simple method to control the amount of overlap by the sidewall or overlap portions 420 over the source/drain tip regions 308. Any well known anisotropic etch back technique, such as plasma etching or reactive ion etching may be utilized.

Figure 4D:
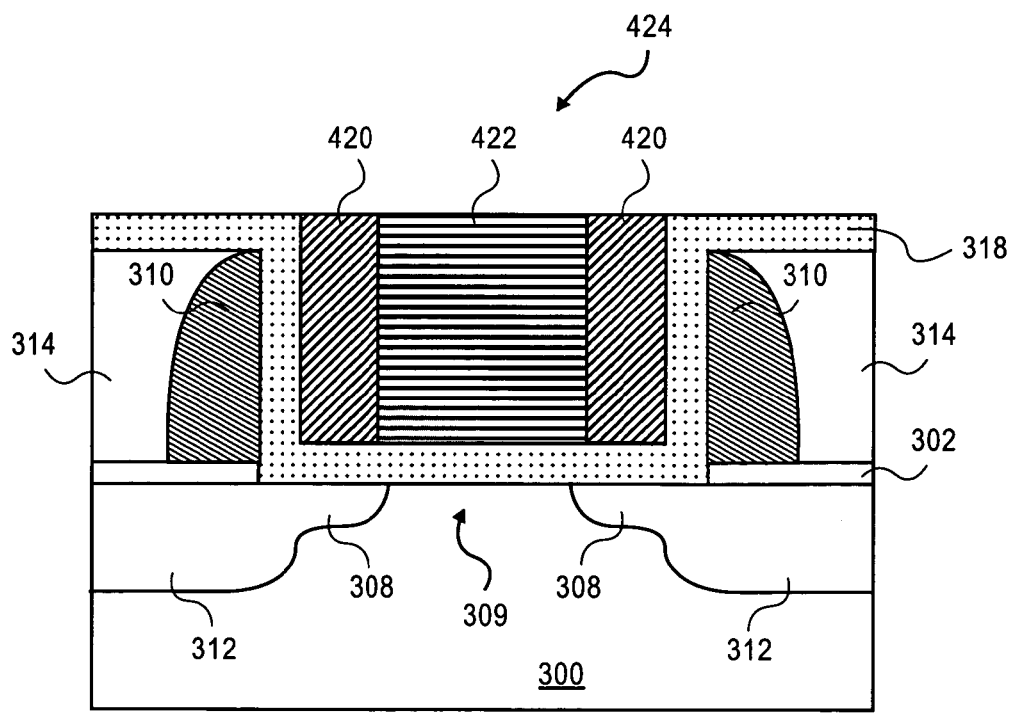

Next, if desired, the overlap portions 420 of the gate electrode may be exposed to reactive species 421 to alter the work function of the overlap or sidewall portions 420. Any well known technique, such as ion implantation, rapid thermal annealing, plasma processing and remote plasma processing may be utilized to introduce or produce the reactive species into first metal portions 420 in order to lower or increase the work functions of the overlap gate electrode portions 420. Next, as shown in FIG. 4D, a second metal film 422 having a second work function can be blanket deposited over the substrate shown in FIG. 4C and then planarized back by, for example, chemical mechanical planaization or plasma etch back to form the central portion 422 of the laterally modulated gate electrode 424. In an embodiment of the present invention, the metal film 422 used to form the central portion of the gate electrode 422 has a second work function which is higher than the first work function of metal used to form the outer portions 420. In an alternative embodiment of the present invention, central portion 422 is formed with a second metal film having a second work function which is less than the work function of a metal used to form outer portions 420 of gate electrode 424. Additionally, in an embodiment of the present invention, overlap portions 420 can be initially formed from the same conductive material used to form the central portion 422, but can have its work function altered or modulated to a different value by the exposure and interaction with reactive species during the process set forth in FIG. 4C.

We claim:

1. An NMOS transistor comprising:
a dielectric layer above a substrate;
a trench in said dielectric layer, wherein the bottom of said trench is directly above said substrate;
a gate dielectric layer in said trench, wherein a first portion of said gate dielectric layer is adjacent to a first sidewall of said trench, wherein a second portion of said gate dielectric layer is adjacent to a second sidewall of said trench, and wherein a third portion of said gate dielectric layer is on the bottom of said trench;
a gate electrode in said trench, wherein said gate electrode is directly between said first and said second portions of said gate dielectric layer, wherein said gate electrode is comprised of a central portion and a pair of outer portions, wherein said outer portions are each comprised of a sidewall region and an extension region, wherein said central portion is directly adjacent to said sidewall region and directly above said extension region of each of said outer portions, wherein the bottom surfaces of said central portion and said pair of outer portions are directly on said third portion of said gate dielectric layer, and wherein the workfunction of said pair of outer portions is lower than the workfunction of said central portion; and
a pair of n type source/drain regions in said substrate on opposite sides of said pair of outer portions of said gate electrode.

2. The transistor of claim 1 wherein the workfunction of said central portion is between 3.9 to 4.3 eV.

3. The transistor of claim 2 wherein the workfunction of said pair of outer portions is between 1.5 to 3.8 eV.

4. The transistor of claim 1 wherein the workfunction of said pair of outer portions is at least 0.1 eV lower than the workfunction of said central portion.

5. The transistor of claim 1 wherein said pair of outer portions is formed from a material selected from the group consisting of scandium (Sc), magnesium (Mg) and Yttrium (Y).

6. The transistor of claim 5 wherein said central portion comprises a conductive material selected from the group consisting of poly-silicon, titanium, zirconium, hafnium, tantalum, and aluminum.

7. The transistor of claim 1 wherein said pair of outer portions of said gate electrode overlap said pair of n type source/drain regions.

8. A PMOS transistor comprising:
a dielectric layer above a substrate;
a trench in said dielectric layer, wherein the bottom of said trench is directly above said substrate;
a gate dielectric layer in said trench, wherein a first portion of said gate dielectric layer is adjacent to a first sidewall of said trench, wherein a second portion of said gate dielectric layer is adjacent to a second sidewall of said trench, and wherein a third portion of said gate dielectric layer is on the bottom of said trench;
a gate electrode in said trench, wherein said gate electrode is directly between said first and said second portions of said gate dielectric layer, wherein said gate electrode is comprised of a central portion and a pair of outer portions, wherein said outer portions are each comprised of a sidewall region and an extension region, wherein said central portion is directly adjacent to said sidewall region and directly above said extension region of each of said outer portions, wherein the bottom surfaces of said central portion and said pair of outer portions are directly on said third portion of said gate dielectric layer, and wherein the workfunction of said pair of outer portions is higher than the workfunction of said central portion; and
a pair of p type source/drain regions in said substrate on opposite sides of said pair of outer portions of said gate electrode.

9. The transistor of claim 8 wherein the workfunction of said central portion is between 4.9 to 5.3 eV.

10. The transistor of claim 9 wherein the workfunction of said pair of outer portions is between 5.4 to 6.0 eV.

11. The transistor of claim 8 wherein the workfunction of said pair of outer portions is at least 0.1 eV higher than the workfunction of said central portion.

12. The transistor of claim 8 wherein said pair of outer portions is formed from a material selected from the group consisting of poly-silicon, platinum, and ruthenium nitride (RuN).

13. The transistor of claim 12 wherein said central portion comprises a conductive material selected from the group consisting of ruthenium and palladium.

14. The transistor of claim 8 wherein said pair of outer portions of said gate electrode overlap said pair of p type source/drain regions.

15. The transistor of claim 1, further comprising:
a pair of n type tip extensions adjacent to said pair of n type source/drain regions, wherein said extension regions of said pair of outer portions of said gate electrode partially overlap said pair of n type tip extensions.

16. The transistor of claim 1, further comprising:
a pair of n type tip extensions adjacent to said pair of n type source/drain regions, wherein said extension regions of said pair of outer portions of said gate electrode are substantially in alignment with said pair of n type tip extensions.

17. The transistor of claim 1, further comprising:
a pair of n type tip extensions adjacent to said pair of n type source/drain regions; and
a channel region in between said pair of n type tip extensions, wherein said extension regions of said pair of outer portions of said gate electrode completely overlap said pair of n type tip extensions and partially overlap said channel region.

18. The transistor of claim 1 wherein said central portion of said gate electrode covers at least 50% of said third portion of said gate dielectric layer on the bottom of said trench.

19. The transistor of claim 18 wherein said central portion of said gate electrode covers at least 70% of said third portion of said gate dielectric layer on the bottom of said trench.

20. The transistor of claim 1 wherein one of the outer portions of said pair of outer portions of said gate electrode is ⌊-shaped and the other outer portion of said pair of outer portions of said gate electrode is ⌋-shaped.

21. The transistor of claim 8, further comprising:
a pair of p type tip extensions adjacent to said pair of p type source/drain regions, wherein said extension regions of said pair of outer portions of said gate electrode partially overlap said pair of p type tip extensions.

22. The transistor of claim 8, further comprising:
a pair of p type tip extensions adjacent to said pair of p type source/drain regions, wherein said extension regions of said pair of outer portions of said gate electrode are substantially in alignment with said pair of p type tip extensions.

23. The transistor of claim 8, further comprising:
a pair of p type tip extensions adjacent to said pair of p type source/drain regions; and
a channel region in between said pair of p type tip extensions, wherein said extension regions of said pair of outer portions of said gate electrode completely overlap said pair of p type tip extensions and partially overlap said channel region.

24. The transistor of claim 8 wherein said central portion of said gate electrode covers at least 50% of said third portion of said gate dielectric layer on the bottom of said trench.

25. The transistor of claim 24 wherein said central portion of said gate electrode covers at least 70% of said third portion of said gate dielectric layer on the bottom of said trench.

26. The transistor of claim 8 wherein one of the outer portions of said pair of outer portions of said gate electrode is ⌊-shaped and the other outer portion of said pair of outer portions of said gate electrode is ⌋-shaped.

27. A transistor comprising:
a dielectric layer above a substrate;
a trench in said dielectric layer, wherein the bottom of said trench is directly above said substrate;
a gate dielectric layer on the bottom of said trench;
a gate electrode in said trench, wherein said gate electrode is comprised of a central portion and a pair of outer portions, wherein said outer portions are each comprised of a sidewall region and an extension region, wherein said central portion is directly adjacent to said sidewall region and directly above said extension region of each of said outer portions, wherein the bottom surfaces of said central portion and said pair of outer portions of said gate electrode are directly on said gate dielectric layer on the bottom of said trench, and wherein the workfunction of said pair of outer portions is different than the workfunction of said central portion; and
a pair of source/drain regions in said substrate on opposite sides of said pair of outer portions of said gate electrode.

28. The transistor of claim 27 wherein the workfunction of said pair of outer portions is at least 0.1 eV different than the workfunction of said central portion.

29. The transistor of claim 27, further comprising:
a pair of tip extensions adjacent to said pair of source/drain regions, wherein said extension regions of said pair of outer portions of said gate electrode partially overlap said pair of tip extensions.

30. The transistor of claim 27, further comprising:
a pair of tip extensions adjacent to said pair of source/drain regions, wherein said extension regions of said pair of outer portions of said gate electrode are substantially in alignment with said pair of tip extensions.

31. The transistor of claim 27, further comprising:
a pair of tip extensions adjacent to said pair of source/drain regions; and
a channel region in between said pair of tip extensions, wherein said extension regions of said pair of outer portions of said gate electrode completely overlap said pair of tip extensions and partially overlap said channel region.

32. The transistor of claim 27 wherein said central portion of said gate electrode covers at least 50% of said gate dielectric layer on the bottom of said trench.

33. The transistor of claim 32 wherein said central portion of said gate electrode covers at least 70% of said gate dielectric layer on the bottom of said trench.

34. The transistor of claim 27 wherein one of the outer portions of said pair of outer portions of said gate electrode is ⌊-shaped and the other outer portion of said pair of outer portions of said gate electrode is ⌋-shaped.

* * * * *